SEMICONDUCTOR STRUCTURE PARTICULARLY FOR PERFORMING UNIPOLAR TRANSISTOR FUNCTIONS IN INTEGRATED CIRCUITS

Filed Dec. 3, 1965

WITNESSES:

John L. Chopp

James F. Young

INVENTORS
Hung C. Lin and
Edmund A. Karcher

BY Gordon H. Telfer
ATTORNEY

United States Patent Office 3,414,782

Patented Dec. 3, 1968

3,414,782

SEMICONDUCTOR STRUCTURE PARTICULARLY FOR PERFORMING UNIPOLAR TRANSISTOR FUNCTIONS IN INTEGRATED CIRCUITS

Hung C. Lin, Silver Spring, and Edmund A. Karcher, Severna Park, Md., assignors to Westinghouse Electric Corporation, Pittsburgh, Pa., a corporation of Pennsylvania Filed Dec. 3, 1965, Ser. No. 511,439
5 Claims. (Cl. 317—235)

ABSTRACT OF THE DISCLOSURE

A unipolar transistor structure, particularly applicable to integrated circuits, made by utilizing lateral diffusion of impurities to provide small channel dimensions and other desirable qualities.

Figure 1:
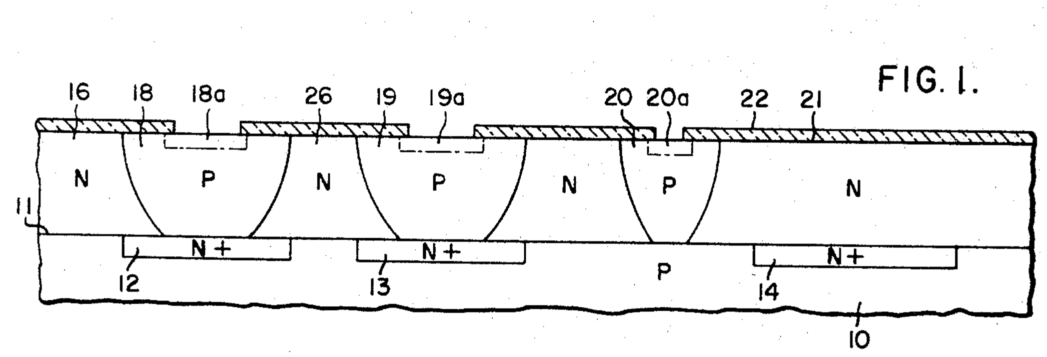

This application relates to semiconductor structures, and methods of fabricating semiconductor structures, particularly for performing unipolar (or junction field effect) transistor functions in integrated circuits.

It is known that to achieve good unipolar transistor characteristics a narrow channel region is desired. It is also preferred that the gate region should be more heavily doped than the channel so that the depletion region will extend into the channel rather than into the gate. It has been proposed that these qualities can be achieved in a structure having a vertical channel region around which the gate region is formed by diffusion of impurities with use being made of the lateral diffusion of the impurities to restrict the dimension of the channel region; see, for example, the Roosild et al. article in Proceedings of the IEEE, July 1963, pages 1059 and 1060.

The prior suggestions are limited to structures not readily incorporated within integrated circuits wherein bipolar transistors are also formed. It is necessary that the operating steps for forming unipolar and bipolar transistors in the asme structure be essentially the same. However, if the bipolar base diffusion is also used to form a unipolar gate region the structure has several drawbacks. The base diffusion does not result in enough lateral diffusion to satisfactorily restrict the channel width, it being recognized that conventional photolithographic techniques do not permit the formation of close tolerance openings less than about 1 mil wide in the oxide diffusion mask. Also, the formation of a low resistivity diffused contact region over a portion of the channel, for either the source or drain contact, that contacts also the gate region will result in an unsatisfactory low drain to gate breakdown voltage, being essentially the same as the base-emitter breakdown voltage of a bipolar transistor. For these reasons, it has not previously been practical to fabricate a vertical channel field effect transistor in an integrated circuit.

It is, therefore, an object of the present invention to provide an improved semiconductor structure for performing unipolar transistor functions that may be fabricated in an integrated circuit.

Another object is to provide an improved method for the fabrication of unipolar transistors, particularly in integrated circuits, by techniques compatible with those used for the fabrication of bipolar transistors.

The invention, briefly, achieves the above-mentioned and additional objects and advantages in a structure including a substrate of a first type of semiconductivity (i.e., p or n) with a first region of a second type of semiconductivity within a portion of a major surface of the substrate in a pattern desired for the unipolar transistor gate region. A layer of a second type of semiconductivity is disposed over the substrate surface and the first region. A second region of a first conductivity type extends through the layer to the first region and provides a unipolar gate region substantially enclosing a portion of the layer. The enclosed portion of the layer serves as the channel region and source and drain contacts may be applied thereto on the surface of the enclosed portion and a portion of the layer outside the second region so that the first region is part of the carrier path.

Utilization of lateral diffusion in the formation of the second or gate region permits a very narrow channel width. The structure may be formed by techniques thoroughly compatible with those for bipolar transistor fabrication because the second region for the unipolar channel may be formed in the same diffusion as for isolation walls in conventional integrated circuit structures. Furthermore, the low resistivity contact area to the channel that, because it is not practical to restrict its lateral dimension, also contacts the gate region will have a relatively high breakdown voltage because the portion of the gate region at its lateral periphery is relatively lowly doped. The gate region may be formed in a diffusion operation as is conventional for forming diffused isolation walls. It may (and the isolation walls may also) be formed by diffusion following the forming of the referred to layer in two portions with the diffusant deposited in the desired pattern on the surface of the first portion.

Figure 2:
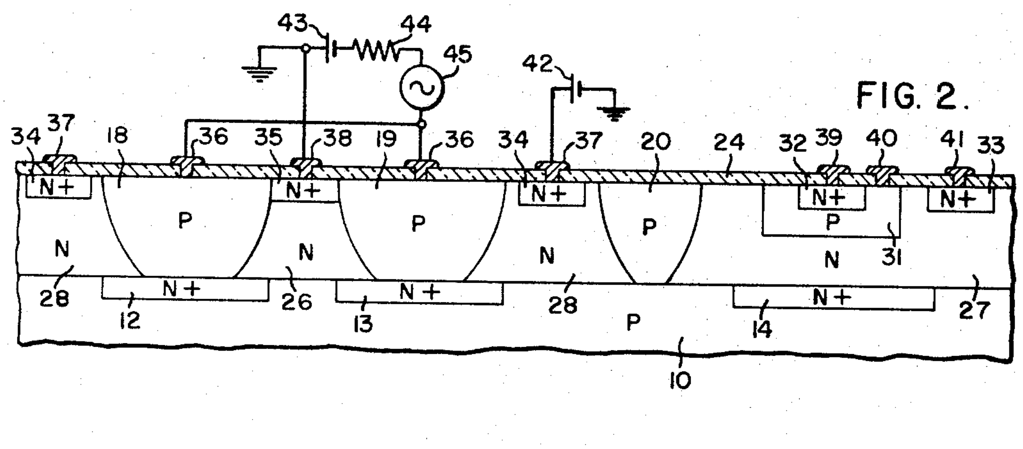
Figure 3:
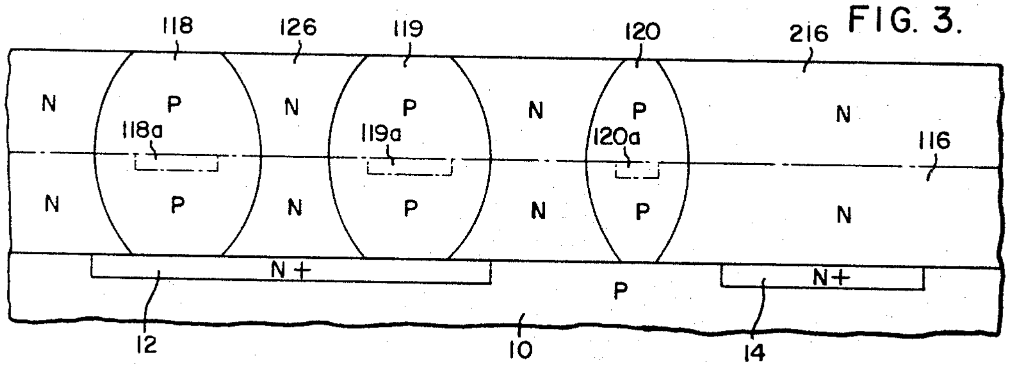

The invention, together with the above-mentioned and additional objects and advantages thereof, will be better understood by referring to the following description taken with the accompanying drawing, wherein:

FIGURES 1 and 2 are partial sectional views of a semiconductor integrated circuit in accordance with the present invention wherein FIGURE 2 also includes a schematic illustration of circuit elements connected to the structure for performing unipolar transistor functions; and FIG. 3 is a partial sectional view of an alternative embodiment corresponding to the stage of fabrication illustrated in FIG. 1.

FIGURE 1 illustrates a structure wherein a p-type substrate 10 has diffused into one of its major surfaces 11 the n+ regions 12, 13 and 14. The semiconductivity type of the various regions may be reversed from that shown by way of illustration. Over the substrate surface 11 and the n+ regions is a layer 16 of n-type material through which there has been diffused p-type regions 18, 19 and 20. On the exposed surface 21 of the n-type layer 16 there is a diffusion mask 22 for the diffusion of the p-type regions 18, 19 and 20.

The substrate 10 may be a conventional wafer portion as is employed in integrated circuit fabrication and serves as a support for the functional elements of the integrated circuit.

The n+ region 14 is, in accordance with the teachings of copending Murphy application Ser. No. 146,624, filed Oct. 20, 1961, now Patent 3,237,062, Feb. 22, 1966, assigned to the assignee of the present invention, for the purpose of reducing saturation resistance in a portion of the structure intended to provide bipolar transistor functions.

The n+ regions 12 and 13, that may conveniently be simultaneously diffused with the region 14, act as a stop to the diffusion of acceptor impurities in forming regions 18 and 19 so that they do not extend to the p-type substrate. The regions 12 and 13 also act as part of the current path in the unipolar transistor structure.

The p-type region 20 is a conventional diffused isolation wall that separates functional elements in the integrated circuit and provides internal electrical isolation. Regions 18 and 19 that conveniently may be formed at the same time as region 20 are the gate regions of the unipolar transistor.

It will be understood that in this description the regions 12 and 13 are described as separate regions and the regions 18 and 19 are described as separate regions. However, it is quite satisfactory for each of those pairs of regions to be a single region with an annular configuration enclosing, respectively, portions of the surface 11 and the n-type layer 16. In general, therefore, it may be said that the gate region or regions at least substantially enclose a portion of the n-type layer 16. The subdiffused n+ regions 12 and 13 need not have any opening between them as is shown.

FIGURE 1 illustrates by the regions 18*a*, 19*a* and 20*a*, defined by the dashed lines, the areas occupied by the initially deposited acceptor impurities for forming regions 18, 19 and 20. This illustrates the utilization of lateral diffusion to form a channel region 26 of desirable dimensions. The diffusion mask 21 has its windows or openings restricted in size to substantially less than the ultimately desired area for the regions 18 and 19. In accordance with known diffusion technology, a quantity of acceptor impurity, such as a boron compound, is deposited in the mask openings. During the diffusion process wherein the initially deposited impurities travel transversely through the layer 16 they also diffuse in a similar manner and at a similar rate laterally through the layer 16. It will be recognized that the dimensions in the drawing are not to scale. Therefore, by correct positioning of the windows for depositions 18*a* and 19*a* and diffusing for a time sufficient to enable impurities to travel to the n+ regions 12 and 13, a narrow channel region 26 results. The channel region 26 may be only a few microns wide and such channels may be formed reproducibly by this technique.

FIGURE 2 shows the structure after completion of the semiconductor structure with circuit elements for performing unipolar transistor functions. In the portion of the structure over the n+ region 14 there have been formed by diffusion operations a p-type region 31 and an n+ region 32 to provide bipolar transistor base and emitter regions, respectively, with the underlying portion 27 of the n-layer 16, together with region 14, providing the collector. Such a bipolar transistor structure is in accordance with conventional integrated circuit techniques. Simultaneously with forming the emitter region 32, n+ regions 33, 34 and 35 are formed, respectively, in the portion 27 of the n-type layer 16 adjacent the base region 31, in the portion 28 of the n-type layer 16 immediately outside the gate regions 18 and 19 and portion 26 of the layer 16 enclosed by the gate regions. The n+ regions 33, 34 and 35 are to facilitate making good ohmic contact to the underlying n-type layer portions 27, 28 and 26, respectively.

Because of the limitations of present photolithographic techniques it is not possible to form an opening in a diffusion mask small enough to permit formation of a region less than the few micron dimension of the unipolar channel region 26. However, this is no drawback by the present technique because the n+ region 35 may contact the gate regions 18 and 19 without serious disadvantage. The laterally diffused portion of the gate regions is of relatively low doping and high resistivity so the breakdown voltage is not unsatisfactory.

An oxide mask 24 on the surface of the structure has windows therein for the contacts to the various regions including contacts 36 to the gate regions 18 and 19, a contact 37 on the n+ region 34, a contact 38 on the n+ region 35, a contact 39 on the emitter region 32, a contact 40 on the base region 31 and a contact 41 on the n+ region 33.

It will be understood that unipolar and bipolar transistor structures as illustrated may be formed in various numbers in a single integrated circuit with interconnections for various circuit functions. The integrated circuit may also include portions providing other elements such as resistors and capacitors formed by compatible technology.

FIG. 2 illustrates the manner of functioning of the illustrated unipolar transistor portion including means to provide a current between the contacts 37 and 38 that serve, respectively, as the drain and source of the unipolar transistor although their functions may be reversed. This means includes a current source such as the battery 42 of a polarity such that majority carriers, electrons in the n-type channel region, travel from contact 38 to contact 37. Additionally, a source of potential such as battery 43 is connected between the contact 38 and the gate contacts 36 to provide a DC bias on the gate contacts 36 of the proper polarity so that the junction between the gate regions 18 and 19 and the channel 26 is reverse biased. A substantial impedance 44 is also provided to limit the current to the gate to a very low level. A signal source 45 is also connected to the gate and, by its modulation of the depletion layer created at the reverse biased junction, the current flow is modulated between the source and drain contacts 37 and 38 in accordance with conventional unipolar transistor operation. The output signal from drain contact 37 can be applied to the bipolar transistor or otherwise utilized. Necessary connections to the bipolar transistor portion may, of course, be made in the usual manner.

It is therefore seen that the present invention provides a thoroughly compatible technique of forming unipolar transistors with good characteristics in integrated circuits with bipolar transistors as is particularly useful in integrating circuits of the unipolar-bipolar amplifier type. Lin et al. Patent 3,210,677, Oct. 5, 1965, discloses examples of such circuits.

Following are more specific examples of various parameters for the design of the structure as illustrated. It is to be understood that considerable variation in materials, impurity concentrations and other features may be made while still resulting in a satisfactory structure.

Substrate 10—p-type Si; 20 ohm-cm.; 8 mils thick.
Regions 12, 13, 14—Diffused with arsenic to a surface concentration of $10^{19}$ a./cc. and a depth of 10 microns.
Layer 16—Formed by reaction of $SiCl_4$ with $H_2$ with a phosphorus dopant for a resistivity of 1.0 ohm-cm.; 17 microns thick.
Depositions 18*a*, 19*a*, 20*a*—Boron doped to a surface concentration of $10^{21}$ a./cc. Depositions 18*a* and 19*a* spaced apart 2 mils.
Regions 18, 19, 20—Surface concentration of $10^{19}$ a./cc. Regions 18 and 19 spaced .25 mil apart.
Region 31—Boron doped to a surface concentration of $10^{18}$ a./cc. and a depth of 3 microns.
Regions 32, 33, 34, 35—Phosphorus doped to a surface concentration of $10^{21}$ a./cc. and a depth of 2 microns.

FIG. 3 illustrates another way in which the present invention may be practiced. The substrate 10 and the n+ regions 12 and 14 may be as in FIG. 1. (In FIG. 3, n+ region 12 extends entirely through the unipolar transistor area rather than being one of two regions or an annular region as in FIG. 1. Structures of the type shown in FIG. 1 may be similarly modified.)

Following formation of the subdiffused regions on the substrate, a first n-type epitaxial layer is grown about half as thick as layer 16 in FIG. 1 (about 10 microns, for example). Impurity depositions 118*a*, 119*a* and 120*a* are formed on the surface of layer 116 in the positions desired for unipolar gate regions and isolation walls. These depositions may, for example, have concentrations giving a sheet resistivity of about 70 ohms per square. An additional layer 216 of n-type epitaxial material is then grown over the surface of layer 116 and the impurity depositions. It may be about the same thickness as layer 116. Upon redistribution of the deposited impurities, the illustrated structure results having gate regions 118 and 119 and isolation wall 120. Subsequent fabrication may be as described in connection with FIG. 2.

The technique described in connection with FIG. 3 is preferred because it results in a narrow channel region 126 and, also, the portions of the gate regions 118 and 119 at the surface of layer 216 are lower doped than the corresponding parts of FIG. 1 so that formation of a source or drain contact region to the channel is more successful; any junction formed with the gate regions has a higher breakdown voltage.

While the present invention has been shown and described in a few forms only, it will be understood that various changes and modifications may be made without departing from the spirit and scope thereof.

What is claimed is:

1. A semiconductor structure comprising: a substrate of a first type of semiconductivity; at least a first region of a second type of semiconductivity within a portion of a major surface of said substrate; a layer of a second type of semiconductivity on a major surface of said substrate; at least one second region of said first type of semiconductivity extending through said layer to said first region, said at least one second region being in a configuration substantially enclosing a first portion of said layer and being separated from said substrate by said first region, said second region being suitable as a unipolar transitor gate region, a first ohmic contact on said second region; and second and third ohmic contacts on said layer, one being on said first portion enclosed by said second region and the other being on a second portion of said layer outside said second region; said second and third ohmic contacts defining a path for direct current through said first portion of said layer, said first region and said second portion of said layer, said path being entirely of material of said second semiconductivity type, said second and third ohmic contacts being suitable as unipolar transistor source and drain contacts with the material of said layer and said first region therebetween being sutiable as a unipolar transistor channel.

2. A semiconductor structure in accordance with claim 1 wherein: a third portion of said layer has therein a third region of said first type of semiconductivity suitable as a bipolar transistor base region with material of said third portion of said layer adjacent said third region being suitable as a collector region and said third region has therein a fourth region of said second type of semiconductivity suitable as a bipolar transistor emitter region; and a fifth region of said first type of semiconductivity extending through said layer to said substrate and isolating said second and third portions of said layer, said fifth region being of material like that of said second region.

3. Electronic apparatus comprising a semiconductor structure in accordance with claim 1 and means to establish a D.C. current between said second and third ohmic contacts and means to apply signals to said second region to modulate said current.

4. A method of fabricating a semiconductor structure for performing unipolar transistor functions comprising: diffusing into a surface of a substrate of a first type of semiconductivity a first region of a second type of semiconductivity; epitaxially growing a layer of said second type of semiconductivity over said surface and said first region; forming by diffusion a second region of said first type of semiconductivity through said layer to said first region and short of the original material of said substrate, said second region being formed in a configuration to enclose a portion of said layer by masking the exposed surface of said layer to provide an opening over said first region with a masked portion within and enclosed by said opening diffusing an impurity capable of imparting semiconductivity of said first type through said opening so that by lateral diffusion the enclosed portion of said layer is restricted to a dimension less than about one-half mil; diffusing low resistivity regions of said second type of semiconductivity into the exposed surface of said layer within and outside said second region, said low resistivity region within said second region being diffused to the extent it contacts only a relatively high resistivity portion of said second region formed by lateral diffusion under the mask used to define said opening; and forming an ohmic contact on said second region and on said low resistivity regions of said layer within and outside of said second region.

5. A method of fabricating a semiconductor structure in accordance with claim 4 wherein: the epitaxial growing of said layer is in two stages between which the impurities for said diffused second region are deposited.

References Cited

UNITED STATES PATENTS

| | | | |
|---|---|---|---|
| 3,197,710 | 7/1965 | Lin | 330—38 |
| 3,271,685 | 9/1966 | Husher et al. | 325—440 |
| 3,275,846 | 9/1966 | Bailey | 307—88.5 |
| 3,295,030 | 12/1966 | Allison. | |
| 3,312,882 | 4/1967 | Pollock | 317—235 |

OTHER REFERENCES

Roosild et al.: Proceedings of the IEEE, July 1963, pp. 1059–1060.

JOHN W. HUCKERT, *Primary Examiner.*

M. EDLOW, *Assistant Examiner.*